(12) United States Patent
Yang

(10) Patent No.: US 6,861,298 B2
(45) Date of Patent: Mar. 1, 2005

(54) METHOD OF FABRICATING CMOS THIN FILM TRANSISTOR

(75) Inventor: Joon Young Yang, Puchun-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 97 days.

(21) Appl. No.: 09/791,032

(22) Filed: Feb. 22, 2001

(65) Prior Publication Data
US 2003/0197207 A1 Oct. 23, 2003

(30) Foreign Application Priority Data

Feb. 24, 2000 (KR) .......................................... 2000-8947

(51) Int. Cl.$^7$ .............................................. H01L 21/00
(52) U.S. Cl. ...................................... 438/149; 438/153
(58) Field of Search ................................ 438/149–155, 438/199–201; 435/229–232

(56) References Cited

U.S. PATENT DOCUMENTS

| 6,004,831 A | * | 12/1999 | Yamazaki et al. | ............ | 438/30 |
| 6,077,730 A | * | 6/2000 | Lee et al. | .................... | 438/149 |
| 6,150,202 A | * | 11/2000 | Imai et al. | .................. | 438/154 |
| 6,300,174 B1 | * | 10/2001 | Bae | ............................. | 438/151 |
| 6,303,963 B1 | * | 10/2001 | Ohtani et al. | ............... | 257/350 |

* cited by examiner

Primary Examiner—H. Jey Tsai
(74) Attorney, Agent, or Firm—McKenna Long & Aldridge LLP

(57) ABSTRACT

A method of fabricating a CMOS thin film transistor. First and second active layers are formed at first and second transistor areas of a transparent substrate. A gate insulating film is formed at middle portions of the first and second active layers while the sides of each are exposed. Each exposed side is ion-doped with a first conductive impurity at a first energy and at a first concentration using the first and second gate electrodes as mask, thus forming first and second high-concentrated areas. A photoresist pattern that covers the first transistor area is formed on the transparent substrate. The second high-concentrated impurity area is ion-doped with a second conductive impurity, at a second energy that is greater than the first energy and at a second concentration that is greater than the first concentration, to form a third high-concentrated impurity area that is counter-doped.

16 Claims, 9 Drawing Sheets

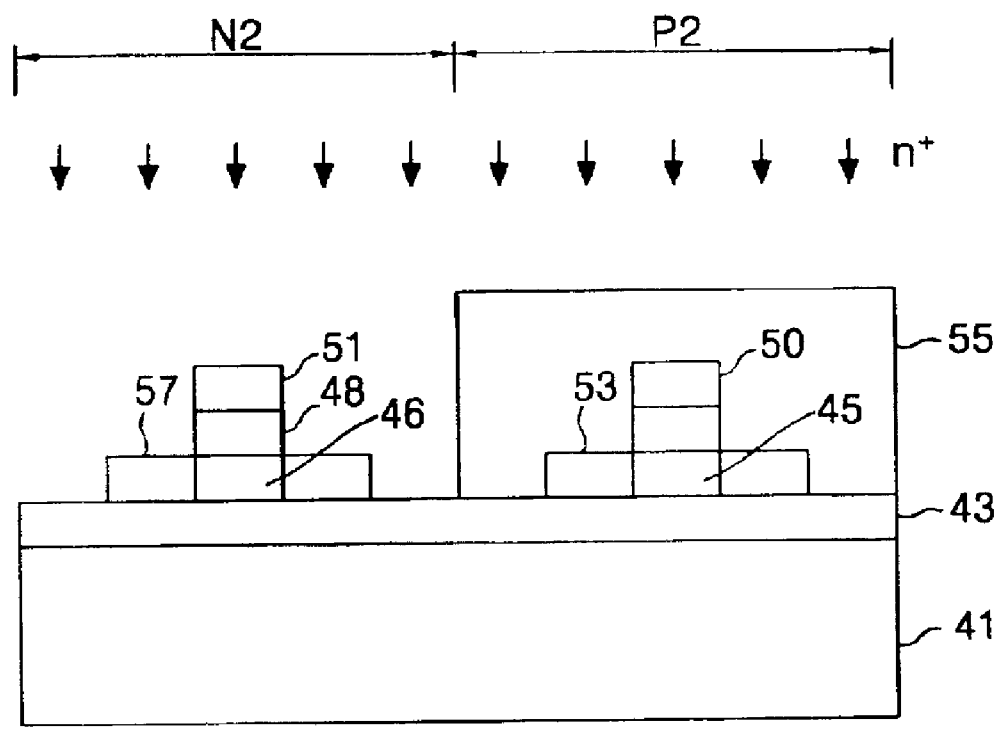

METHOD OF FABRICATING CMOS THIN FILM TRANSISTOR

This application claims the benefit of Korean Patent Application No. 2000-08947, filed on Feb. 24, 2000, which is hereby incorporated by reference for all purposes as if fully set forth herein.

BACKGROUND OF THE INVENTION

1. Field of the Invention

The present invention relates to a method of fabricating a CMOS thin film transistor, and more particularly to a method of fabricating a CMOS thin film transistor that reduces an off current of an n-type thin film transistor.

2. Discussion of the Related Art

Generally, in a CMOS thin film transistor (TFT), the n-type TFT has a high current driving ratio when in the "ON" state, but a large leakage current in the "OFF" state. When used in a liquid crystal display (LCD), the large leakage current of the n-type TFT changes the value of a signal stored in a pixel electrode, which leads to reduced picture quality. Accordingly, to reduce leakage, n-type TFTs having LDD (lightly doped drain) structures or offset structures have been suggested.

FIG. 1A to FIG. 1D are sectional views representing a method of fabricating a conventional CMOS-TFT.

Referring to FIG. 1A, a silicon oxide is deposited on a transparent substrate 11, such as glass, using the chemical vapor deposition (CVD) technique, thereby forming a buffer layer 13. The substrate 11 includes a p-type transistor area P1 and an n-type transistor area N1. A polycrystalline silicon layer is then formed on the buffer layer 13 and patterned by photolithography to form first and second active layers 15 and 16 at the p-type transistor area P1 and the n-type transistor area N1, respectively.

Referring now to FIG. 1B, a silicon oxide is deposited on the buffer layer 13 by the CVD technique so as to cover the first and second active layers 15 and 16, thereby forming an insulating material film. Then, a conductive metal such as aluminum (Al) or copper (Cu) is deposited onto the insulating material film by sputtering to form a conductive metal film.

The conductive metal film and the insulating material film are then patterned by photolithography so as remain only on the middle portions of the first and second active layers 15 and 16. Thus, both sides of the first and second active layers 15 and 16 are exposed. The insulating material film remaining on the first and second active layers 15 and 16 becomes a gate insulating film 18. The conductive metal film remaining over the first active layer 15 becomes a first electrode 20. The conductive metal film remaining over the second active layer 16 becomes a second gate electrode 21.

Subsequently, the first and second active layers 15 and 16 are doped with n-type impurity ions, such as P or As, at a low concentration while using the first and second gate electrodes 20 and 21 as masks. The result is first and second low-concentrated impurity areas 23 and 24.

Referring to FIG. 1C, a photoresist is then coated on the transparent substrate 11. That photoresist is then patterned by exposure and development to form a first photoresist pattern 25 that covers the n-type transistor area N1. At this time, the entire surface of the first low-concentrated impurity area 23 within the p-type transistor area P1 is exposed.

The exposed portion of the first low-concentrated impurity area 23 (see FIG. 1B) is then ion-doped with a p-type impurity, such as B or $BF_2$, at a high concentration using the first gate electrode 20 and the first photoresist pattern 25 as masks. The result is a first high-concentrated impurity area 27, which becomes source and drain areas of the p-type TFT. In this case, the first high-concentrated impurity area 27 is formed by doping a p-type impurity at a high concentration such that the first low-concentration impurity area 23 doped with an n-type impurity is counter-doped with a p-type impurity. The portion of the first active layer 15 under the first gate electrode 20 becomes a channel area of the p-type TFT.

Referring to FIG. 1D, the first photoresist pattern 25 is then removed. Then, a second photoresist layer 29 is coated on the transparent substrate 11. Thereafter, the second photoresist layer is exposed and developed to leave the second photoresist pattern 29 over the entire p-type transistor area P1, and to form a photoresist pattern 25 over a desired portion of the second active layer 16. That desired portion is adjacent the second gate electrode 21. The result is that part of the second low-concentrated impurity area 24 is exposed, and part is covered by the photoresist pattern 25.

The exposed portion of the second low-concentrated impurity area 24 is then doped with n-type impurity ions, such as P or As, at a high concentration using the photoresist pattern 25 as a mask. The result is a second high-concentrated impurity area 31, which becomes source and drain areas of the n-type TFT. The second low-concentrated impurity area 24 that remains becomes an LDD (lightly doped drain) area of the n-type TFT. The portion of the second active layer 16 under the second gate electrode 21 becomes a channel area of the n-type TFT.

Thereafter, although not shown, the second photoresist pattern 29 and the photoresist pattern 25 are removed.

While useful, the conventional CMOS-TFT fabricating method described above has a problem in that its fabrication process is rather complicated. The impurity areas of the n-type TFT and the p-type TFT require two photo processes and three ion-doping processes. Another problem is that since the LDD areas of the n-type TFT are controlled by formation of the n-type high-concentrated impurity areas, the LDD areas can have non-uniform lengths. This deteriorates the device characteristics.

SUMMARY OF THE INVENTION

Accordingly, the present invention is directed to a method of fabricating CMOS thin film transistors that substantially obviates one or more of the problems due to limitations and disadvantages of the related art.

An object of the present invention is to provide a method of fabricating a CMOS thin film transistor wherein n-type and p-type impurity areas are formed using simplified photo processes and ion-doping processes.

A further object of the present invention is to provide a method of fabricating a CMOS thin film transistor wherein an LDD area of a n-type TFT is formed on a self-alignment basis to have a uniform length so as to improve device characteristics.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a CMOS thin film transistor according to the present invention includes the steps of forming first and second active layers on desired portions of first and second transistor areas of a transparent substrate, and then forming a gate insulating film on the middle portions of the first and second active layers. Then, forming first and second gate electrodes on the gate insulating film. The method continues by ion-doping the exposed sides of the first and second active layers with a first conductive impurity at a first energy and at a first concentration using the first and second gate electrodes as masks so as to form first and second high-concentrated doped areas. Then, a photoresist pattern covering the first transistor area is formed. The exposed second high-concentrated impurity area on the transparent substrate is then ion-doped with a second conductive impurity at a second energy that is higher than the first energy and at a second concentration that is greater than the first concentration. This forms a third high-concentrated impurity area that is counter-doped.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 2A to FIG. 2C are section views illustrating a method of fabricating a thin film transistor according to an embodiment of the present invention;

DETAILED DESCRIPTION OF THE PREFERRED EMBODIMENTS

Reference will now be made in detail to the preferred embodiment of the present invention, an example of which is illustrated in the accompanying drawings.

Figure 1A:
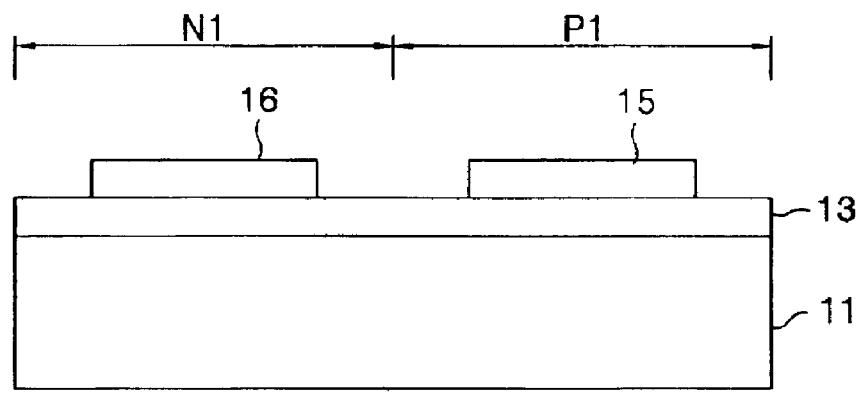
FIG. 1A to FIG. 1D are section views illustrating a conventional method of fabricating a thin film transistor.
Figure 1B:
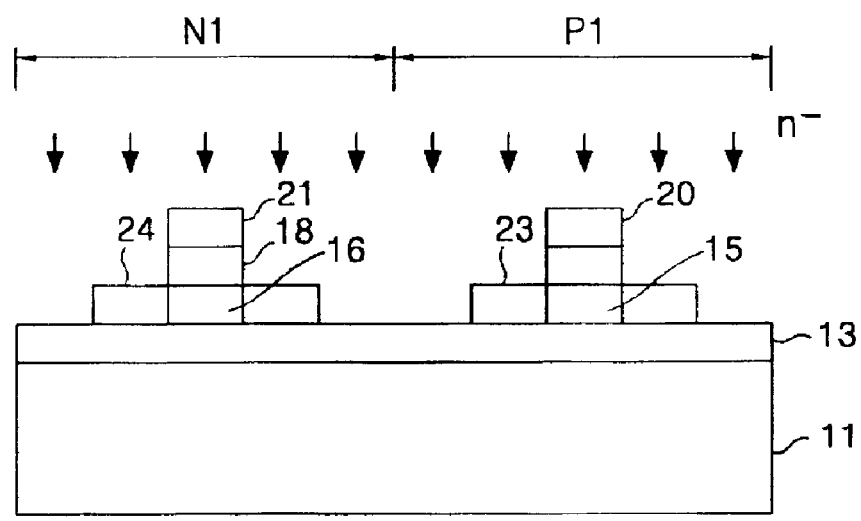
Figure 1C:
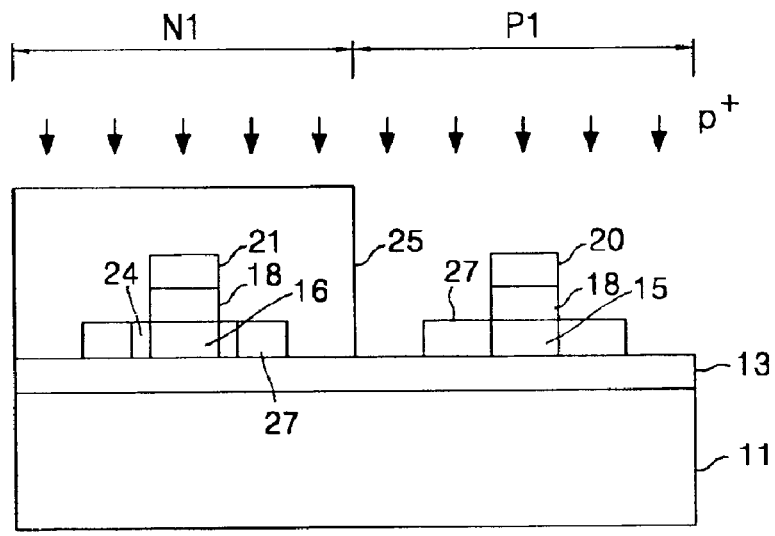
Figure 1D:
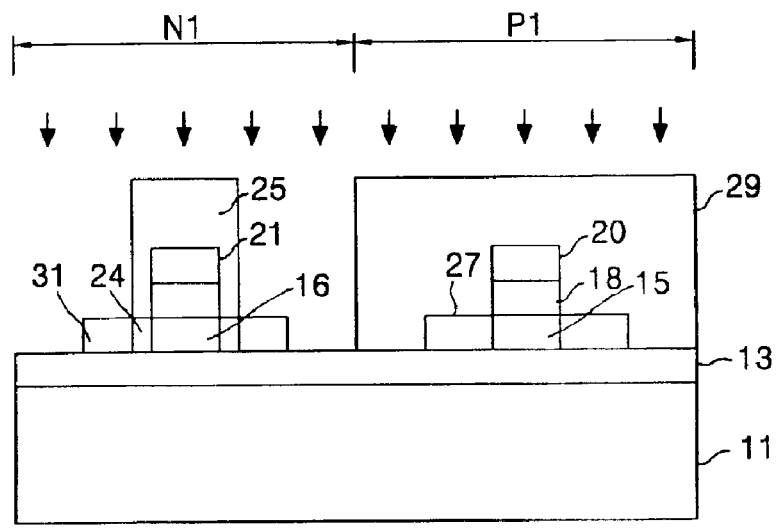
Figure 2A:
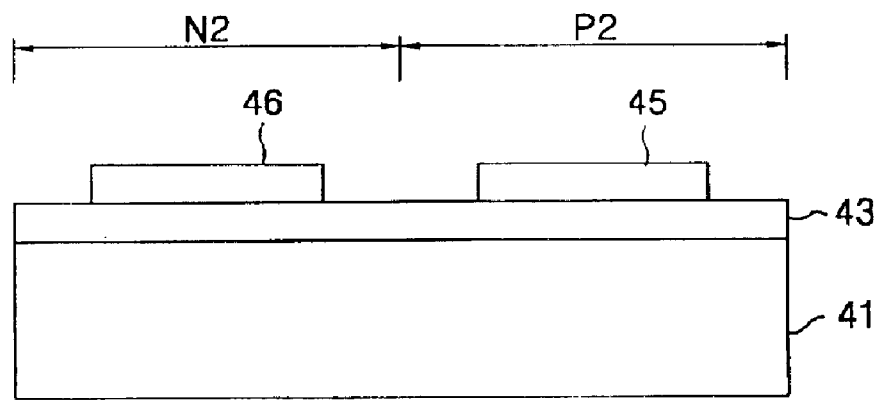
Figure 2B:
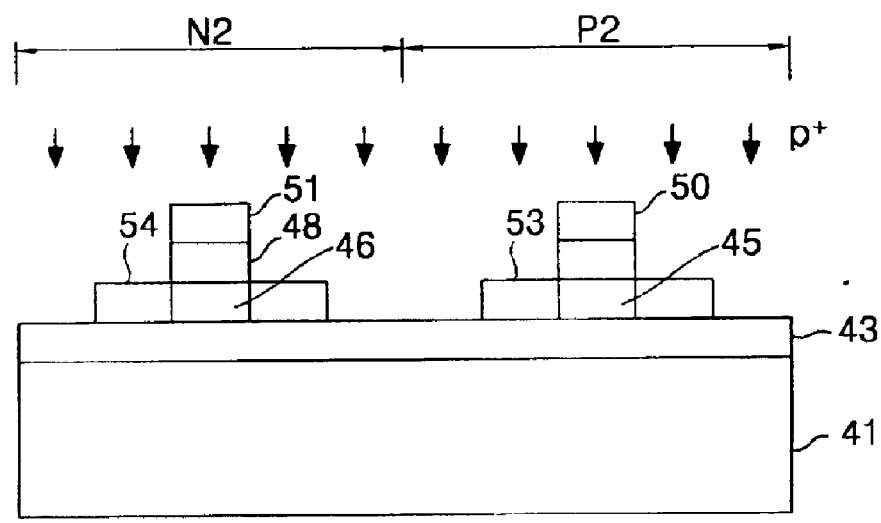

FIG. 2A to FIG. 2C shows a process of fabricating a thin film transistor (TFT) according to an embodiment of the present invention.

Referring to FIG. 2A, a silicon oxide or a silicon nitride is deposited onto a transparent substrate 41, beneficially of a glass. The transparent substrate 41 has a p-type transistor area P2 and an n-type transistor area N2. Using the chemical vapor deposition (CVD) technique a buffer layer 43 is formed. An undoped polycrystalline silicon is deposited onto the buffer layer 43 at a thickness of about 400 Å to 800 Å. The polycrystalline silicon is patterned by photolithography to expose the buffer layer 43 and to form first and second active layers 45 and 46 at desired areas of the p-type transistor area P2 and the n-type transistor area N2.

While the first and second active layers 45 and 46 may be formed by depositing a polycrystalline silicon, they may also be formed by depositing an amorphous silicon by the CVD technique and then annealing it with a laser beam to become a polycrystalline silicon. The buffer layer 43 prevents an impurity on the substrate 41 from being diffused into the first and second active layers 45 and 46.

Referring now to FIG. 2B, a silicon oxide or a silicon nitride is deposited onto the buffer layer 43 by the CVD technique in such a manner as to cover the first and second active layers 45 and 46, thereby forming an insulating material film. Then, a conductive metal, such as aluminum (Al) or copper (Cu), is deposited onto the insulating material film by the sputtering technique to form a conductive metal film.

The conductive metal film and the insulating material film are then patterned by photolithography so as to remain only at the middle portions on the first and second active layers 45 and 46. Thus, both sides of the first and second active layers 45 and 46 are exposed. At this time, the insulating material film remaining on the first and second active layers 45 and 46 becomes a gate insulating film 48. Further, the conductive metal film remaining over the first active layer 45 becomes a first gate electrode 50. The conductive metal film remaining over the second active layer 46 becomes a second gate electrode 51.

Subsequently, the exposed portions of the first and second active layers 45 and 46 are doped with p-type impurity ions, such as B or $BF_2$, at an energy of about 10 to 20 KeV and at a dose of about $5 \times 10^{14}$ to $5 \times 10^{15}/cm^2$. During doping, the first and second gate electrodes 50 and 51 act as masks. The result is first and second high-concentrated impurity areas 53 and 54.

Referring to FIG. 2C, a photoresist is coated on the transparent substrate 41. That photoresist is then exposed and developed to form a photoresist pattern 55 at the p-type transistor area P2. At this time, the entire surface of the second high-concentrated impurity area 54 (see FIG. 2B) is exposed.

The exposed portion of the second high-concentrated impurity area 54 is then ion-doped with an n-type impurity, such as P or As, at an energy of about 30 to 60 KeV and at a dose of about $1 \times 10^{15}$ to $1 \times 10^{16}/cm^2$. The second gate electrode 51 acts as a mask and the photoresist pattern 55 protects the p-type transistor area P2. The result is a third high-concentrated impurity area 57. In this case, the third high-concentrated impurity area 57 is formed by doping an n-type impurity at one to three times greater concentration such that the second high-concentration impurity area 54 doped with a p-type impurity is counter-doped with an n-type impurity, thereby forming an area doped with an n-type impurity at a high concentration.

Since the doping energy of the n-type impurity that formed the third high-concentrated impurity area 57 is much greater than the p-type impurity that formed the second high-concentrated area 54, the n-type impurity is distributed more widely than the p-type impurity. Accordingly, a high resistance area in which only the n-type impurity is distributed is formed within the second active layer 46 at a region adjacent the second electrode 51. This high resistance area alleviates an electric field between the gate and the drain of the n-type TFT to prevent a flow of an off current $I_{off}$.

The third high-concentrated impurity area 57, which is used as the source and drain areas of the n-type TFT, is formed in a self-alignment manner. The overall fabrication process is not only simplified, but also a revival property and device reliability can be improved.

The p-type TFT uses the first high-concentrated impurity area 53, which is p-type doped, as source and drain areas.

The n-type TFT uses the third high-concentrated impurity area 57, which is n-type doped, as the source and drain areas. In the p-type and n-type TFTs, portions adjacent the first and second gate electrodes 50 and 51 of the first and second active layers 45 and 46, respectively, become channel areas.

Thereafter, although being not shown, the photoresist pattern 55 is removed.

Figure 3:
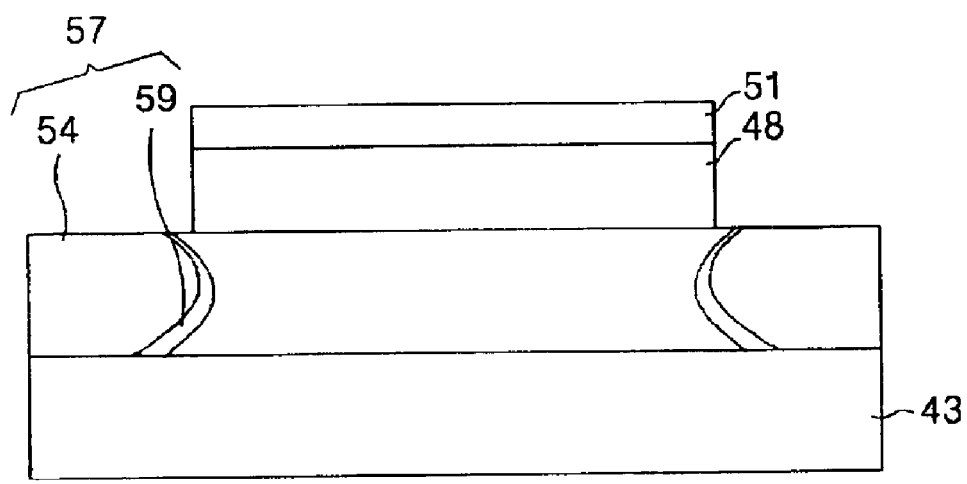
FIG. 3 is a schematic view representing a doped state of the n-type TFT fabricated by the present method.
Figure 3:
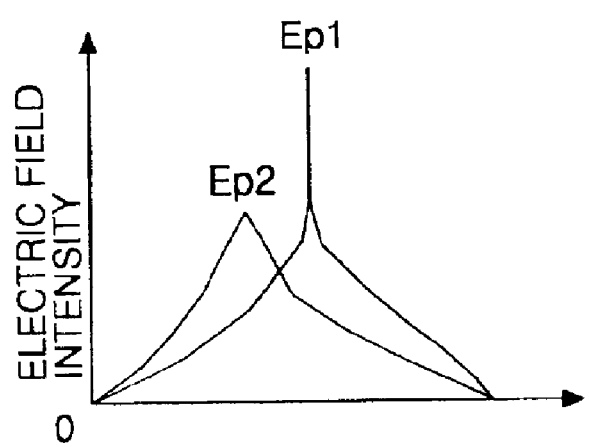
Figure 4A:
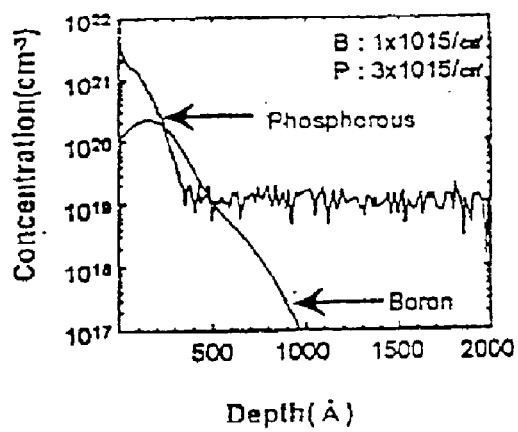
FIG. 4A to FIG. 4D are graphs representing $p^+$ and $n^+$ doping profiles according to an injection energy of an $n^+$ impurity.
Figure 4B:
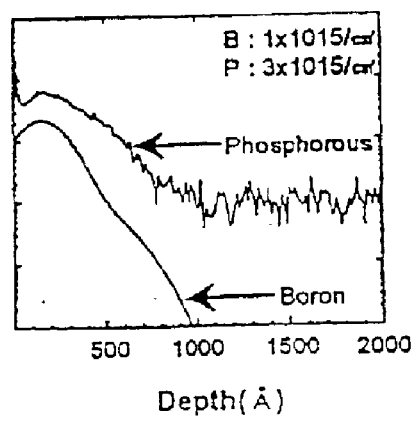
Figure 4C:
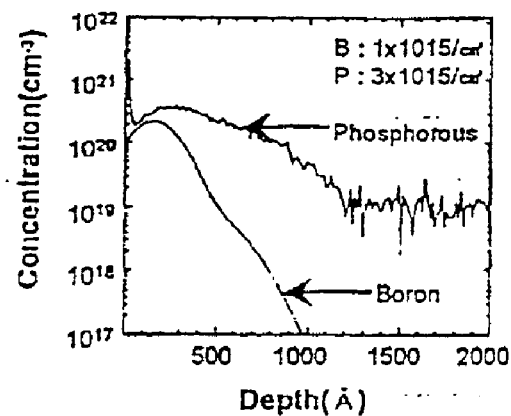
Figure 4D:
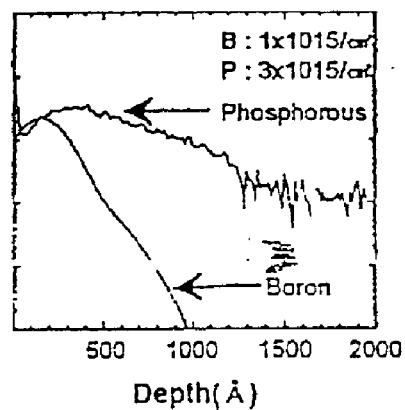
Figure 5A:
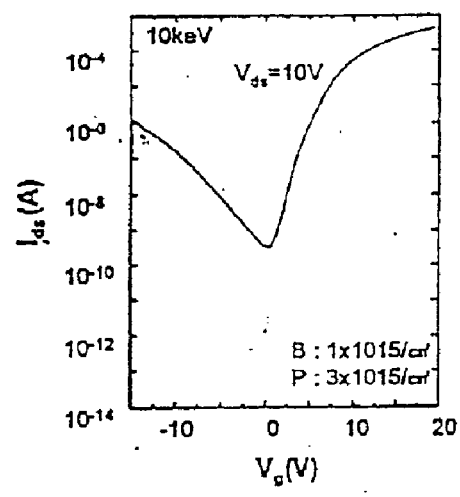
FIG. 5A to FIG. 5D are graphs representing a variation in a drain-source current (Ids) of the n-type TFT according to injection energy of a $n^+$ impurity.
Figure 5B:
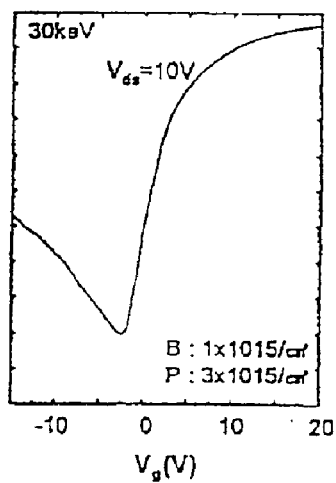
Figure 5C:
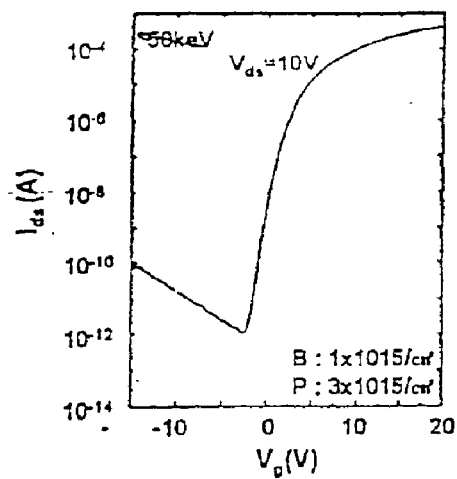
Figure 5D:
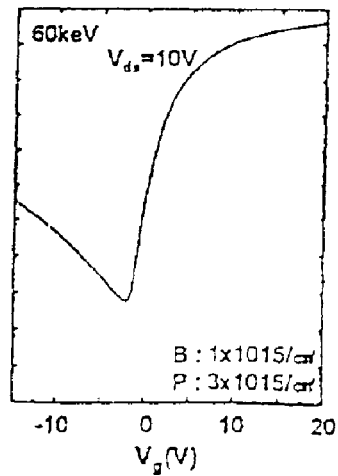

FIG. 3 shows a doped state of the n-type TFT manufactured by the present method. Referring to FIG. 3, in the n-type TFT, the third high-concentrated area 57 has such a structure that the high resistance area 59 at which only n-type impurities are distributed extends from the second high-concentrated impurity area 54 doped with a p-type impurity. In this case, the high resistance area 59 reduces the electric field Ep between the gate and the drain from Ep1 to Ep2. Accordingly, the off current $I_{off}$ of the n-type TFT is reduced.

FIG. 4A to FIG. 4D are graphs representing $p^+$ and $n^+$ doping profiles according to injection energy of the $n^+$ impurity.

The second high-concentrated impurity area 54 (see FIG. 2B) is formed by ion-doping boron (B) at an energy of 10 KeV and at a dose of $1\times10^{15}/cm^2$. The third high-concentrated impurity area 57 (see FIG. 2C) is formed by ion-doping phosphorus (P) at a dose of $3\times10^{15}/cm^2$, while gradually changing an energy with 10 KeV, 30 KeV, 50 KeV and 60 KeV. If the phosphorus (P) is ion-doped at a 10 KeV, then the concentration of the phosphorus (P) at the surface is much greater than that of the boron (B). However, if the phosphorus (P) is ion-doped at 30 KeV or 50 KeV, then the concentration of the phosphorus (P) at the surface thereof is gradually lowered to be slightly only greater than that of the boron (B). Furthermore, if the phosphorus (P) is ion-doped at 60 KeV, then the concentration of the phosphorus (P) at the surface thereof becomes lower than that of the boron (B) because the phosphorus (P) has a larger doping depth than the boron (B).

FIG. 5A to FIG. 5D are graphs representing the variation in the off current $I_{off}$ of the n-type TFT according to the injection energy of the $n^+$ impurity. In FIGS. 5A to 5D, the drain-source current Ids is measured against a changing gate voltage Vg when the drain-source voltage Vds of the n-type TFT was 10V.

If phosphorus (P) is ion-doped at 10 KeV, then, the drain-source current Ids, that is, the off current $I_{off}$, becomes approximately $10^{-6}$ A under a gate voltage Vg of –15V because the concentration of phosphorus (P) is high at the surface.

However, if phosphorus (P) is ion-doped at 30 KeV or 50 KeV, the drain-source current Ids, that is, the off current $I_{off}$, becomes approximately $10^{-9}$ A or $10^{-10}$ A, respectively, under a gate voltage Vg of –15V because the concentration of phosphorus (P) at the surface is lowered.

Furthermore, if phosphorus (P) is ion-doped at 60 KeV, the drain-source current Ids, that is, the off current $I_{off}$, increase to approximately $10^{-8}$ A, under a gate voltage Vg of –15V as the concentration of the phosphorus (P) becomes lower at the surface than that of the boron (B).

As described above, according to the present invention, each exposed side of the first and second active layers is ion-doped with a P-type impurity at a high concentration and at a high energy using the first and second gates as a mask to form first and second high-concentrated impurity areas. This forms the p-type TFT at the p-type transistor area. Sequentially, the photoresist pattern covering the p-type transistor area is formed, and the second high-concentrated impurity area is doped with a n-type impurity, in an ion self-alignment manner, to form a third high-concentrated impurity area, thereby forming the n-type TFT at the n-type transistor area. Thus, the impurity area of the CMOS-TFT is formed using one photographic process and two ion dopings.

Accordingly, the photo processes and the ion-doping processes can be reduced, thus simplifying the overall fabrication process. Also, the LDD area of the n-type TFT is self-aligned to have a uniform length, thus the device characteristics can be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a CMOS thin film transistor, comprising:
    forming first and second active layers at desired portions of first and second transistor areas of a transparent substrate;
    introducing a gate insulating film to each middle portion of the first and second active layers to expose each side thereof, thereby forming first and second gate electrodes;
    ion-doping each exposed side of the first and second active layers with a first conductive impurity under a first energy and a first concentration using the first and second gate electrodes as a mask to form first and second impurity areas;
    forming a photoresist pattern covering the first transistor area and exposing the second impurity area on the transparent substrate; and
    ion-doping the second impurity area with a second conductive impurity under a second energy greater than the first energy and a second concentration greater than the first concentration to form a third impurity area.

2. The method according to claim 1, wherein the first conductive impurity is a p-type impurity, and the second conductive impurity is an n-type impurity.

3. The method according to claim 2, wherein the first and second impurity areas are formed by an ion-doping of a p-type impurity of B or $BF_2$.

4. The method according to claim 3, wherein the first and second impurity areas are formed by an ion-doping at an energy of 10 to 20 KeV and a dose of $5\times10^{14}$ to $5\times10^{15}/cm^2$.

5. The method according to claim 1, wherein the third impurity area is formed from a n-type impurity of P or As.

6. The method according to claim 5, wherein the third impurity area is formed by an ion-doping at an energy of 30 to 60 KeV and a dose of $1\times10^{15}$ to $1\times10^{16}/cm^2$.

7. A method of fabricating a CMOS thin film transistor, comprising:
    forming a first active layer at a first area of a transparent substrate;
    forming a second active layer at a second area of said transparent substrate;
    forming a first gate electrode over a middle portion of said first active layers wherein ends of said first active layer are exposed by said first gate electrode;
    forming a second gate electrode over a middle portion of said second active layers wherein ends of said second active layer are exposed by said second gate electrode;

ion-doping said ends of said first active layer and said ends of said second active layer with a first conductive impurity at a first energy and at a first concentration, wherein first impurity areas are formed on said ends of said first active layer, and wherein second impurity areas are formed on said ends of said second active layer;

forming a photoresist pattern over said first impurity areas; and ion-doping said second impurity areas with a second impurity at a second energy that is greater than said first energy and at a second concentration that is greater than said first concentration to form a third impurity area;

wherein said first impurity and said second impurity are opposite types.

8. The method of fabricating a CMOS thin film transistor according to claim 7, wherein said first conductive impurity is a p-type impurity.

9. The method of fabricating a CMOS thin film transistor according to claim 8, wherein said first conductive impurity includes boron.

10. The method of fabricating a CMOS thin film transistor according to claim 9, wherein said first impurity areas and said second impurity areas are formed by ion-doping at an energy of between 10 and 20 KeV.

11. The method of fabricating a CMOS thin film transistor according to claim 10, wherein said first impurity areas and said second impurity areas are formed by ion-doping at a dose between $5\times10^{14}$ and $5\times10^{15}/cm^2$.

12. The method of fabricating a CMOS thin film transistor according to claim 7, wherein said third impurity area is formed from an n-type impurity.

13. The method of fabricating a CMOS thin film transistor according to claim 12, wherein said n-type impurity is P.

14. The method of fabricating a CMOS thin film transistor according to claim 12, wherein said n-type impurity is As.

15. The method of fabricating a CMOS thin film transistor according to claim 13, wherein said third impurity area is formed by ion-doping at an energy of between 30 and 60 KeV.

16. The method of fabricating a CMOS thin film transistor according to claim 13, wherein said third impurity area is formed by ion-doping at a dose of between $1\times10^{15}$ and $1\times10^{16}/cm^2$.

* * * * *